United States Patent [19]
Hayden et al.

[11] Patent Number: 5,279,976
[45] Date of Patent: Jan. 18, 1994

[54] METHOD FOR FABRICATING A SEMICONDUCTOR DEVICE HAVING A SHALLOW DOPED REGION

[75] Inventors: James D. Hayden; James R. Pfiester; David Burnett, all of Austin, Tex.

[73] Assignee: Motorola, Inc., Schaumburg, Ill.

[21] Appl. No.: 695,119

[22] Filed: May 3, 1991

[51] Int. Cl.$^5$ .................. H01L 21/331; H01L 21/225
[52] U.S. Cl. ........................................ 437/31; 437/33; 437/44; 437/162
[58] Field of Search ................. 437/31, 32, 33, 162

[56] References Cited

U.S. PATENT DOCUMENTS

| | | | |
|---|---|---|---|
| 4,419,810 | 12/1983 | Riseman . | |
| 4,465,528 | 8/1984 | Goto | 437/162 |
| 4,502,202 | 3/1985 | Malhi | 437/162 |
| 4,839,305 | 6/1989 | Brighton | 437/41 |
| 5,064,774 | 11/1991 | Pfiester | 437/162 |
| 5,091,328 | 2/1992 | Miller | 437/162 |
| 5,137,840 | 8/1992 | Desilets et al. | 437/32 |
| 5,141,895 | 8/1992 | Pfiester et al. | 437/162 |
| 5,153,146 | 10/1992 | Toyoshima et al. | 437/162 |

OTHER PUBLICATIONS

"The Effects of Boron Penetration of p+ Polysilicon Gated PMOS Devices", J. Pfiester, et al., IEEE Trans. Elect. Dev., 37(8), 1990, p. 1842.

"Study of Boron Penetration Through Tin Oxide with P+ Polysilicon Gate", J. Sun, et al., Dig. Int. Symp. on VLSI Technology, 1989, p. 17.

"Redistribution of Acceptor and Donor Impurities during Thermal Oxidation of Silicon", A. Grove et al., J. Appl. Phys. 35(9), 1964, p. 2695.

*Primary Examiner*—Mary Wilczewski
*Attorney, Agent, or Firm*—James L. Clingan, Jr.; Jasper W. Dockrey

[57] ABSTRACT

A method is provided for the formation of ultra-shallow boron doped regions in a semiconductor device. In one embodiment of the invention an N-type semiconductor substrate (15) is provided having a first P-type region formed therein. A dielectric layer (16) is formed on the substrate surface and a material layer (17) doped with fluorinated boron is formed on the dielectric layer (16). A second P-type region (22), characterized by a high dopant concentration at the substrate surface and a uniform junction profile, is formed in the substrate adjacent to the first P-type region by diffusing boron atoms from the material layer (17) through the dielectric layer (16) and into the substrate (15). The second P-type region (22) has a very shallow junction depth which is closer to the substrate surface than the first P-type region.

19 Claims, 6 Drawing Sheets

METHOD FOR FABRICATING A SEMICONDUCTOR DEVICE HAVING A SHALLOW DOPED REGION

FIELD OF THE INVENTION

This invention relates in general to a method for fabricating a semiconductor device, and more particularly to a method for fabricating a VLSI semiconductor device incorporating shallow doped regions having a high dopant concentration at the surface.

BACKGROUND OF THE INVENTION

The semiconductor industry is characterized by a trend toward fabricating larger and more complex circuits on a given semiconductor chip. The larger and more complex circuits are achieved by reducing the size of individual devices within the circuits and spacing the devices closer together. As the dimensions of the individual components within a device such as an MOS or bipolar transistor are reduced and the device components brought closer together, improved electrical performance can be obtained. However, attention must be given to the formation of doped regions in the substrate to insure that deleterious electrical field conditions do not arise.

As the size of device components such as the transistor gate in an MOS device and the emitter region in a bipolar device, are reduced, the junction depth of doped regions formed in the semiconductor substrate must also be reduced. The formation of shallow junctions having a uniform doping profile and a high surface concentration has proven to be very difficult. A commonly used technique is to implant dopant atoms into the substrate with an ion implantation apparatus. Using ion implantation, the high energy dopant atoms bombard the surface of the substrate at high velocity and are driven into the substrate. While this method has proven effective for the formation of doped regions having moderately deep junctions, the formation of ultra-shallow junctions using ion implantation is extremely difficult. Both the path of the energized dopant atoms within the substrate and the implant uniformity are difficult to control at the low energies necessary to form shallow implanted junctions. The implantation of energized dopant atoms damages the crystal lattice in the substrate which is difficult to repair. Dislocations resulting from the lattice damage can easily spike across a shallow junction giving rise to current leakage across the junction. Moreover, the implantation of P-type dopants such as boron, which diffuse rapidly in silicon, results in excessive dispersion of dopant atoms after they are introduced into the substrate. It then becomes difficult to form a highly confined concentration of P-type dopant atoms in a specified area in the substrate and especially at the surface of the substrate.

A similar problem is encountered when a dopant such as boron is diffused from an overlying polysilicon layer directly into a silicon substrate. The boron rapidly diffuses through the polysilicon and into the substrate. The rapid introduction of boron atoms into the substrate, coupled with the high diffusivity of boron in silicon, results in excessive lateral diffusion.

The most serious consequence of the excessive dopant diffusivity is termed "lateral diffusion" wherein a diffused region extending laterally parallel with the surface of the substrate is formed. If the lateral diffusion becomes too great, the device performance will be severely degraded and in the worst case, total functional failure occurs. In P-channel MOS transistors and NPN vertical bipolar transistors, the active components which substantially determine performance factors such as current gain and switching speed are fabricated by forming shallow boron doped regions in the substrate. For example, the boron doped LDD portion of the MOS P-channel transistor must offset the drain electric field from the channel region to prevent hot carrier injection while simultaneously carrying a large quantity of charge to maintain a high current gain. In the vertical NPN bipolar transistor, the boron doped base region must have a high dopant concentration to maintain high current gain but not excessively overlap the emitter region. Excessive lateral diffusion of the base regions can result in a low emitter-base breakdown voltage and hot carrier injection along the periphery of the emitter.

In VLSI device fabrication, as dimensions become smaller, lateral dopant diffusion, especially P-type dopant diffusion, must be minimized in order to fully realize enhanced device performance. This is necessary to prevent the associated electric fields of the doped regions from overlapping and forming unwanted parasitic capacitors within the device.

BRIEF SUMMARY OF THE INVENTION

In practicing the present invention there is provided a method of fabricating a semiconductor device having shallow boron doped regions formed in a semiconductor substrate. The boron doped regions are characterized by a shallow junction depth and a high dopant surface concentration. In one embodiment, an N-type semiconductor substrate is provided and a dielectric layer is formed on the substrate surface. A material layer having a fluorinated-boron component is formed overlying the dielectric layer. A first P-type impurity region having a first selected junction depth is formed in the substrate. Boron atoms are diffused in the presence of hydrogen from the fluorinated material layer through the dielectric layer and into the substrate. The boron diffusion forms a second P-type impurity region having a high surface concentration adjacent to the first P-type region. The second P-type region has a PN junction which is closer to the surface of the substrate than the PN junction of the first P-type region. The second P-type region is further characterized by a high dopant concentration at the substrate surface and a uniform junction profile in the substrate.

Figure 1:
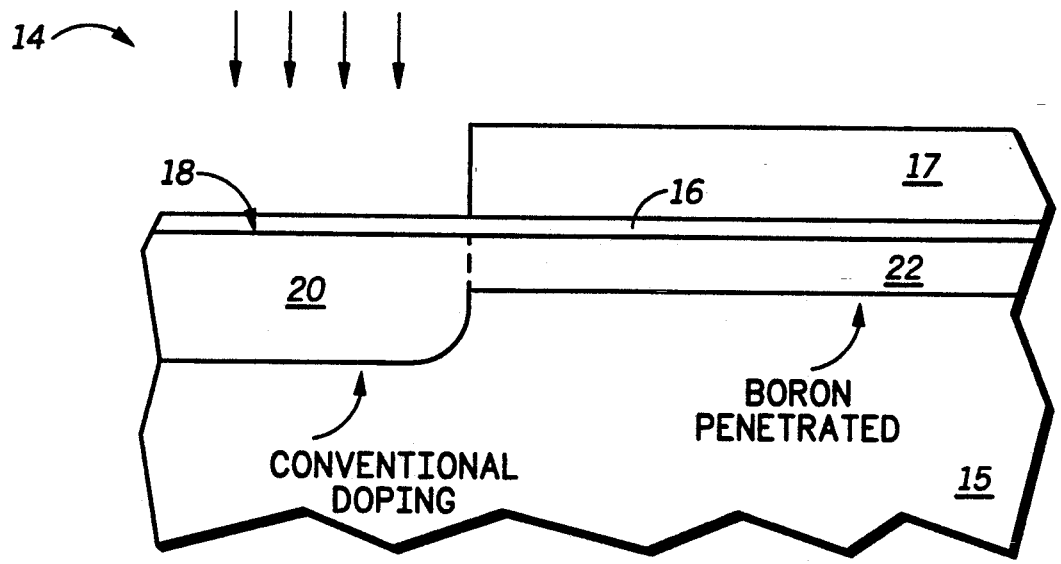
FIG. 1, illustrates, in cross section, a doped region of a semiconductor device formed in accordance with the invention in comparison with a conventionally formed doped region.
Figure 2:
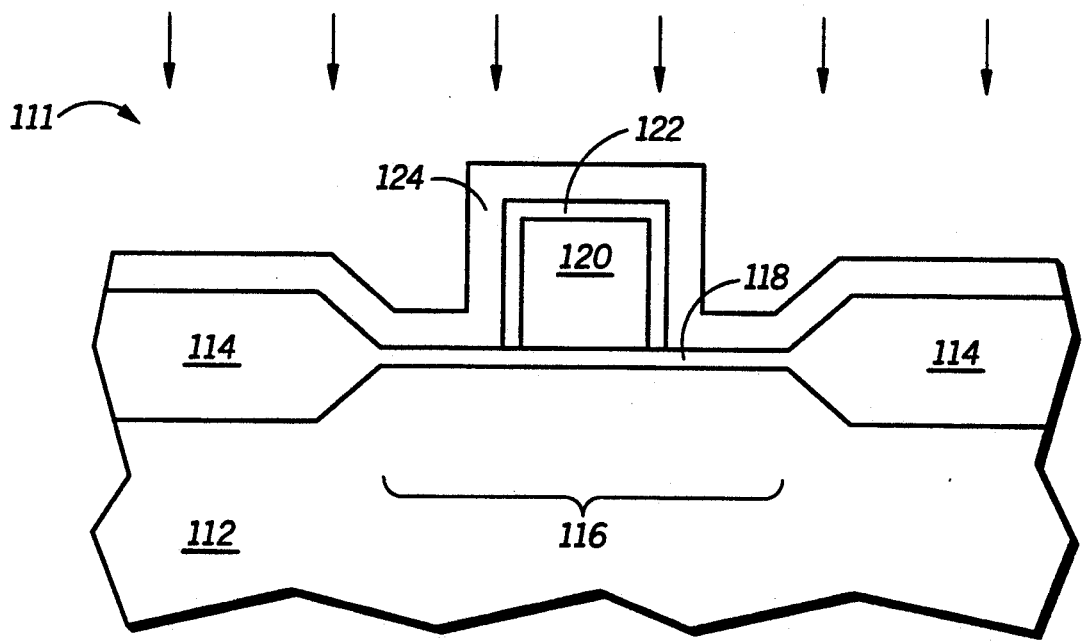
FIGS. 2–5 illustrate, in cross section, process steps in accordance with one embodiment of the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION THE INVENTION

It has been discovered that boron can be diffused in the presence of hydrogen from a fluorinated semiconductor material through an underlying dielectric layer and into an N-type semiconductor substrate to form a shallow diffused region in the substrate. The diffusion process forms a P-type region having a high boron concentration at the substrate surface. It has further been discovered that a PN junction created by the boron diffusion can, under a specified set of process conditions, be reproducibly formed at a precise depth in the substrate. The ability to repeatably form a shallow P-type region having a smooth PN junction profile and having a high impurity concentration at the substrate surface offers performance advantages in both MOS and bipolar transistor device applications. The process of the present invention will be described in terms of a general embodiment to be followed by specific process embodiments thereof.

Illustrated in FIG. 1, in cross section, is a portion of a semiconductor device 14 including an N-type substrate 15 having a dielectric layer 16 overlying a portion of the substrate surface. Dielectric layer 16 has a thickness ranging from about 7.5 to 17.5 nanometers and can be formed by thermally oxidizing the surface of substrate 15. Alternatively dielectric layer 16 can be formed by chemical vapor deposition (CVD), RF sputtering, molecular beam deposition and the like. A layer 17 of semiconductor material overlies a portion of dielectric layer 16 leaving a portion 18 of the substrate surface covered only by dielectric layer 16. Layer 17 has as a constituent a fluorinated-boron component distributed throughout the body of the structure shown in FIG. 1. Layer 17 can be any semiconducting material capable of incorporating a fluorinated-boron component and releasing boron upon exposure to thermal radiation. Preferably, layer 17 is polysilicon impregnated with fluorine atoms and boron atoms. Excess fluorine is present in a ratio of about two flourine atoms to one boron atom however, this ratio can vary depending upon the specific process conditions used. For example, the fluorine and boron atoms can be introduced into layer 17 by molecular deposition, ion implantation, CVD and the like during film formation. In a preferred embodiment, difluoroboron is ion implanted into layer 17 with a dose of about $10^{15}$ to $10^{16}$ ions per square centimeter which, after annealing, yields a total boron surface concentration in the range of about $10^{17}$ to $10^{20}$ atoms per cubic centimeter. Once layer 17 has been formed having a fluorinated boron component, a photolithographic patterning process is used followed by anisotropic etching to form the configuration shown in FIG. 1.

The structure illustrated in FIG. 1 further includes an ion implanted region 20 which is formed by ion implantation of boron ions through dielectric layer 16 and into substrate 15. The implant dose and energy is adjusted to produce as shallow boron distribution profile as possible while maintaining a high surface concentration of boron atoms. The junction formed in the substrate by the ion implantation process is labeled "conventional doping" in FIG. 1. After the formation of implanted region 20, device 14 is subjected to a thermal annealing process to repair crystal damage caused by the implanted atoms and to diffuse boron atoms from layer 17 into substrate 15. The thermal anneal can be carried out in a conventional convection furnace or by a radiative process such as rapid thermal annealing The diffusion process forms a P-type impurity region 22 in substrate 15. The PN junction formed by the boron diffusion into the N-type substrate, labeled "boron penetrated", occurs at a uniform shallow distance from the substrate surface. The distance of the PN junction from the substrate surface, or in other words, the junction depth, is dependent upon by the diffusion rate of boron atoms through the dielectric material. The deeply channeled implanted region 20 is characteristic of the formation of boron regions using a conventional ion implant process and can be directly compared with the uniform shallow junction formed by the process of the present invention.

Process Embodiment I

FIGS. 2-5 illustrate process steps in accordance with one embodiment of the invention. Shown in FIG. 2, in cross section, is a portion of a semiconductor device 111 having already undergone some of the process steps in accordance with the invention. Device 111 includes an N-type semiconductor substrate region 112 which can be a uniformly doped continuous semiconductor body or a doped region of a semiconductor body such as an N-type well region, or an N-type tub, or the like. In the case of formation of a CMOS device, substrate region 112 will have an adjacent P-type region of similar construction (not shown). A field insulator 114 defines an active region 116 in substrate region 112. Preferably field insulator 114 is a thermally grown silicon oxide which is partially recessed into the silicon substrate and which, at least in part, extends above the original surface. A thin dielectric layer 118 overlies the active region 116 and a gate electrode 120 overlies dielectric layer 118 in a central portion of active region 116. Dielectric layer 118 is preferably silicon oxide thermally grown to a thickness of about 7.5 to 25 nanometers and gate electrode 120 is preferably formed from N-type polysilicon CVD deposited to a thickness of about 200 to 300 nanometers. A thermal oxidation process is carried out to form a silicon oxide layer 122 overlying gate electrode 120 and a layer 124 of semiconductor material is blanket deposited overlying gate electrode 120, dielectric layer 118 and field insulator 114. Layer 124 is preferably polysilicon CVD deposited to a thickness of about 150 nanometers. Layer 124 is doped with boron and fluorine atoms preferably by ion implantation of difluoroboron ($BF_2$) with a dose of about $10^{15}$ to $10^{16}$ ions per square centimeter and a implant energy of ranging from about 25 to 100 KeV.

Figure 3:
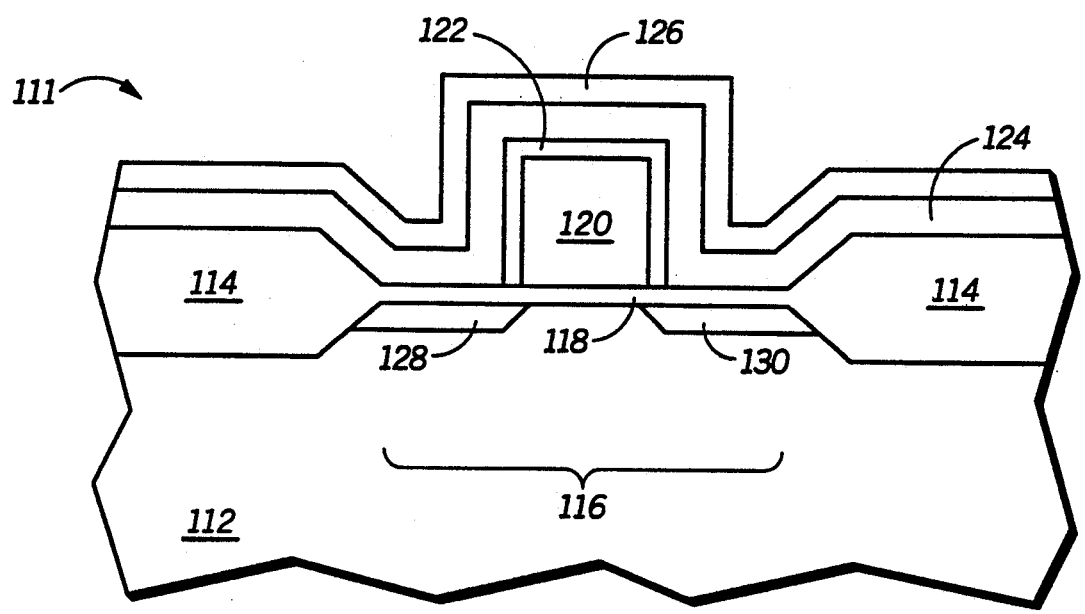

After the formation and doping of layer 124, a capping layer 126 is deposited overlying layer 124, as shown in FIG. 3. Capping layer 126 is formed from a diffusion barrier material such as silicon nitride deposited to a thickness sufficient to prevent the out-diffusion of boron atoms from layer 124. Capping layer 126 can also be formed by the deposition of an oxynitride material. Once capping layer 126 is formed, device 111 is thermally annealed at a temperature of about 800° to 1000° C. for about 5 to 60 minutes to form shallow P-type diffused source and drain regions 128 and 130 in active region 116. The thermal annealing process diffuses boron atoms from layer 124 through dielectric layer 118 forming shallow PN junctions at a precise distance from the substrate surface. Those skilled in the art will appreciate that the optimum process conditions will be dependent upon the materials used and the desired characteristics of the shallow boron region formed in the substrate. For example, the annealing temperature and time will depend upon several factors including, the total boron dose delivered to the semiconductor material layer, the thickness of the semiconductor material layer and the thickness of the dielectric layer.

Figure 4:
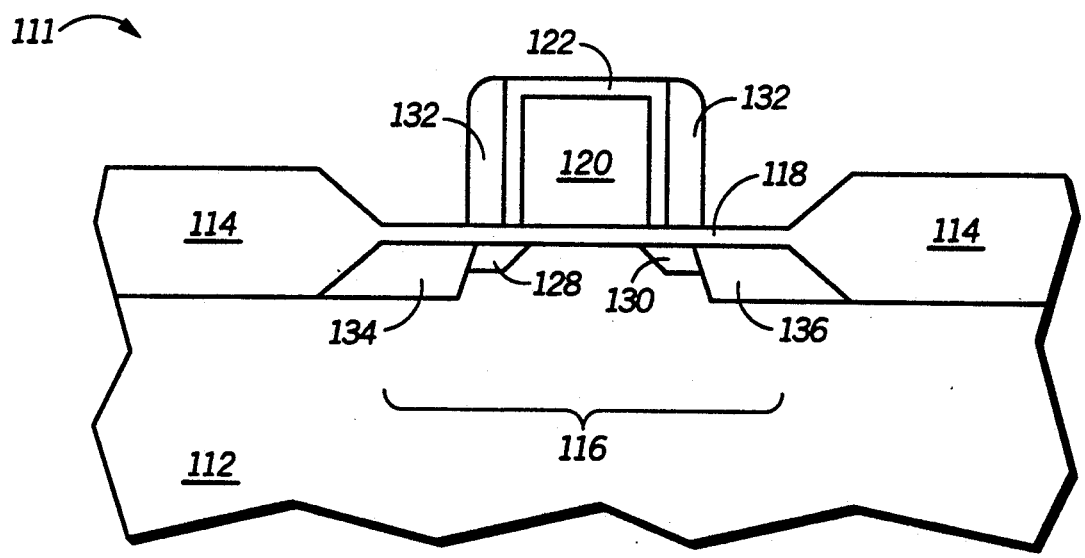

Following the formation of P-type diffused regions 128 and 130, capping layer 126 is removed by an isotropic etching process and layer 124 is anisotropically etched to from a sidewall spacer 132 on the edge of gate electrode 120, as shown in FIG. 4. Anisotropic etching is an etch process carried out in a reactive-ion-etch (RIE) reactor using a combination of etch gases, and reactor conditions, which result in more rapid etching of a material in the vertical direction than the horizontal direction. The directionality of the anisotropic RIE process applied to layer 124 results in the formation of sidewall spacer 132 having a substantially vertical edge. Additionally, etch gases are such as chlorine and hydrogenated halogens are used which will react with the material of layer 124 much more rapidly than dielectric layer 118 underlying layer 124. Once sidewall spacer 132 is formed, active area 116 is implanted with boron atoms to form heavily doped P-type source and drain regions 134 and 136. The boron implant is self-aligned to gate electrode 120 and diffused source and drain regions 128 and 130 by using sidewall spacer 132 as an implant mask.

Figure 5:
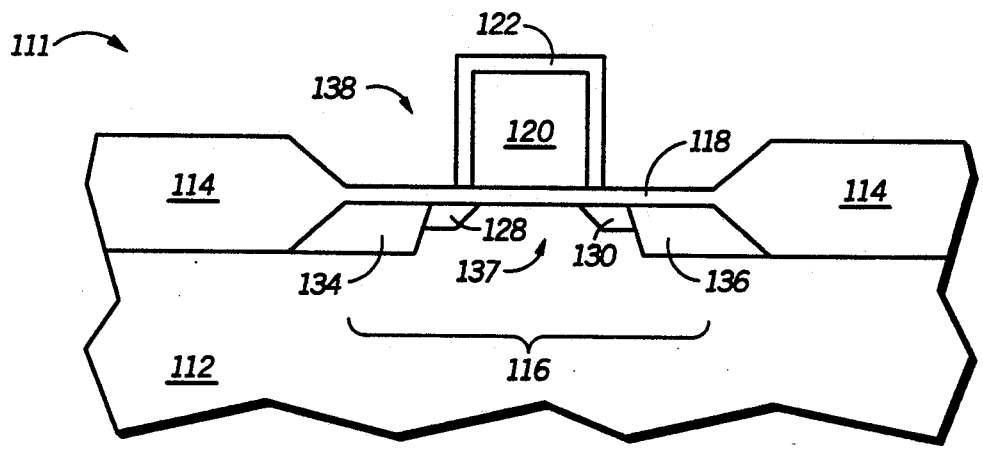

Sidewall spacer 132, being of no further use, is removed by an isotopic etch and device 111 is annealed at about 900 for about 15 minutes to form an MOS transistor 138, as illustrated in FIG. 5. The source of transistor 138 includes a heavily doped region 134 and a more lightly doped region 128. Similarly, the drain of transistor 138 includes a heavily doped region 136 and a more lightly doped region 130.

The source and drain structures illustrated, with a heavily doped region and a lightly doped region are representative of the well known LDD structure. A channel region 137 separates the source and drain regions. As a result of the fabrication process in accordance with the invention, MOS transistor 138 exhibits improved operating performance compared to a transistor having a conventionally formed LDD structure. For example, the lateral diffusion of boron into channel region 137 is reduced by the boron diffusion process used to form lightly doped regions 128 and 130. The reduced lateral diffusion results in fewer short channel effects such as drain induced barrier lowering (DIBL). Additionally, adverse effects from gate-induced-drain-leakage (GIDL) are reduced because the high surface concentration region, obtained by controlled boron diffusion through dielectric layer 118, minimizes lateral band bending of the oxide/silicon interface near the gate edge. Furthermore, the drain breakdown voltage is increased because the boron diffusion process provides a high boron surface concentration in lightly doped regions 128 and 130. Further description of the foregoing advantages of the invention and comparative results are hereinafter provided in an example illustrative of the invention.

Process Embodiment II

To obtain optimum performance in vertical bipolar transistor fabricated to VLSI dimensions, attention must be given to the impurity concentrations and profile in the intrinsic base region and in the extrinsic base region near the edges of the diffused emitter. Excessive overlap of the highly doped extrinsic base region around the emitter lowers the emitter-base breakdown voltage and increases hot-carrier injection along the emitter periphery. Conversely, if the impurity concentration in the extrinsic base region adjacent to the emitter is too low the base resistance will be large and lateral punch-through of charge carriers between the emitter and the collector can occur. In the present embodiment, the impurity concentration and distribution profile of the extrinsic base immediately adjacent to the emitter is established in a precise manner by diffusing the impurity through a dielectric layer formed on a portion of the active device surface. The extrinsic base region is self-aligned to the dielectric layer which, upon diffusion of impurities therethrough, produces a tapered base link between the extrinsic and intrinsic base regions.

The base link formed in accordance with the invention provides a region having a precise electrical resistance and a shallow distribution profile which avoids excessive base impurity concentrations at the edge of the emitter region and spaces the extrinsic base region apart a predetermined distance from the intrinsic base region.

Figure 6:
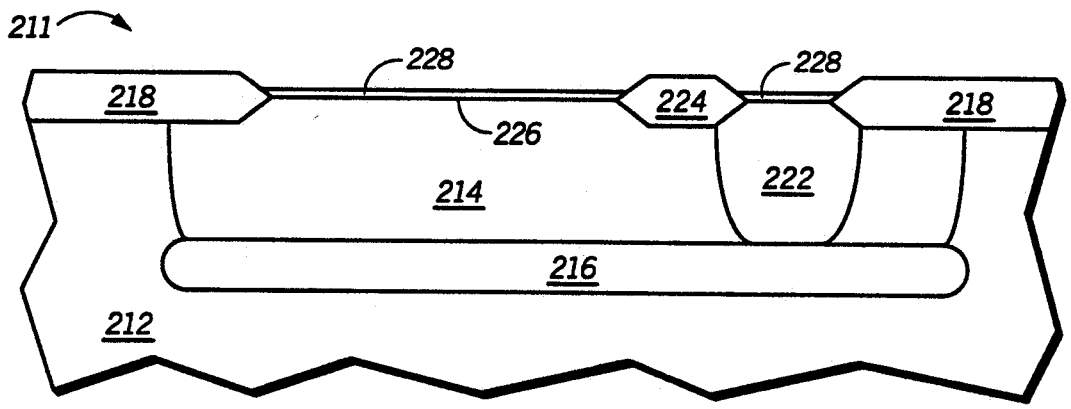
FIGS. 6–10 illustrate, in cross section, process steps in accordance with another embodiment of the invention.

FIGS. 6-10 illustrate schematically in cross section process steps in accordance with a second embodiment of the invention. A portion of a semiconductor device 211 formed in accordance with this embodiment is shown in FIG. 6. Device 211 includes a substrate 212 having an N-type well region 214 overlying an N-type buried layer 216. Typically, substrate 212 is comprised of an epitaxial layer overlying a single crystal silicon body. Buried layer 216 is formed by doping a portion of the single crystal silicon surface prior to forming the epitaxial layer.

Device 211 further includes an isolation region 218 formed at the substrate surface and a collector contact 222 extending from the surface of substrate 212 to buried layer 216. At the substrate surface, collector contact 222 is spaced apart from well region 214 by an intermediate portion 224 of isolation region 218. Intermediate portion 224 defines an active surface 226 overlying well region 214. Collector contact 222 is conventionally formed by diffusing N-type impurity atoms into substrate 212. A screen layer 228, formed on active surface 226 overlies well region 214 and collector contact 222. Isolation region 218 provides electrical isolation to electrically isolate active surface 226 from adjacent devices. Preferably, isolation region 218 is formed from a thick silicon oxide layer which is at least partially recessed into the substrate surface. Screen layer 228 can be any dielectric material through which semiconductor dopant impurity atoms can diffuse and which is differentially etchable with respect to a semiconductor material. In a preferred embodiment, screen layer 228 is silicon oxide formed on active surface 226 by thermal oxidation.

Figure 7:
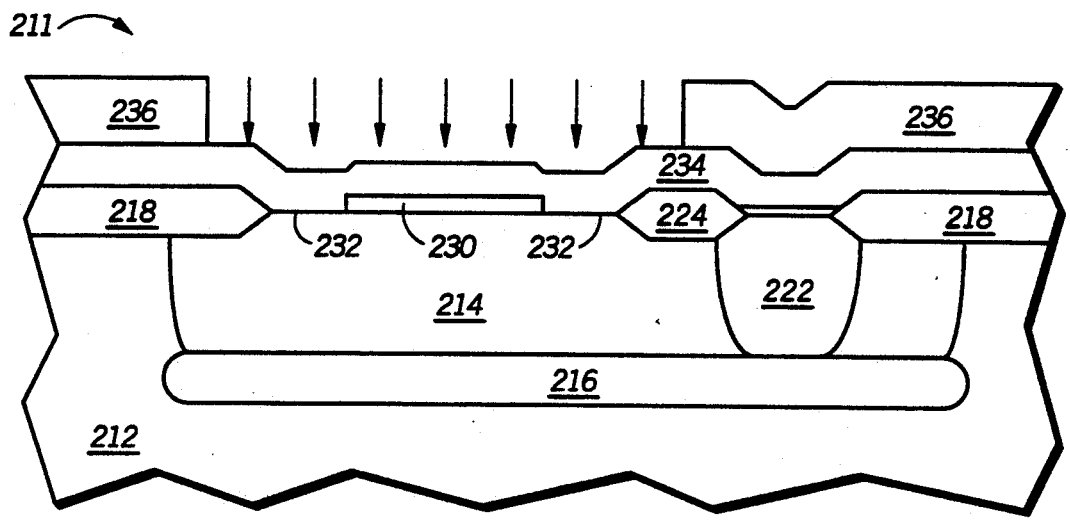
Figure 8:
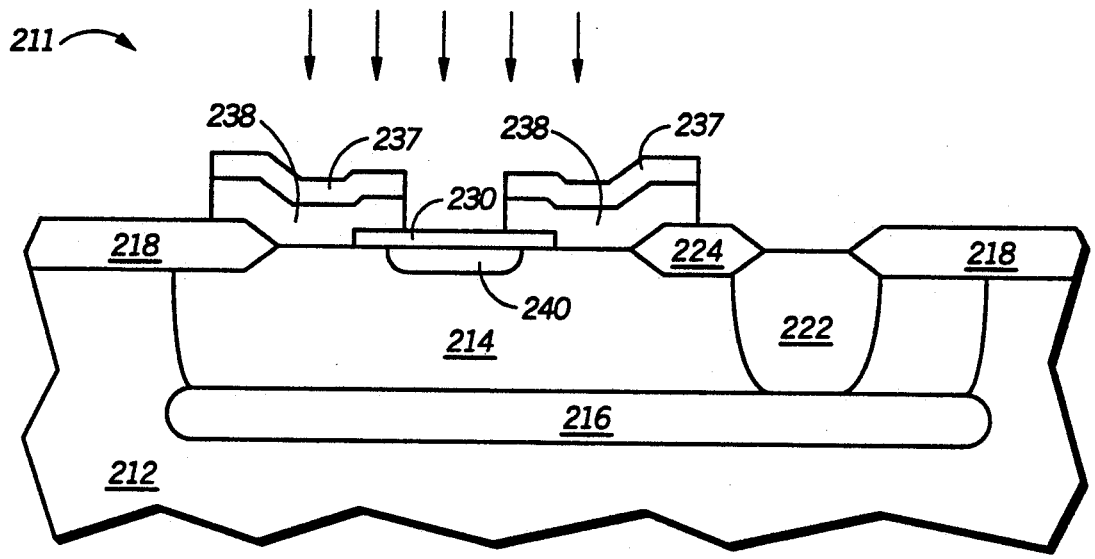

In accordance with the invention, screen layer 228 is patterned and etched to form a oxide pad 230 overlying a central portion of active surface 226, as illustrated in FIG. 7. The etch exposes a base contact region 232 in the periphery of active surface 226 adjacent to the edges of oxide pad 230. A layer 234 of semiconductor material, preferably polysilicon deposited by CVD, is formed overlying oxide pad 230 and base contact region 232. Next, a photomask pattern 236 is formed on semiconductor layer 234 exposing a base contact portion of layer 234 and the exposed portion is doped with boron and fluorine atoms preferably by ion implantation of $BF_2$ with a dose of about $10^{14}$ to $10^{16}$ ions per square centimeter and a implant energy of about 40 to 80 KeV.

After doping semiconductor layer 234, photomask pattern 236 is removed and a layer 237 of insulating material is deposited overlying layer 234. The insulating material is preferably silicon oxide deposited to a thickness of about two hundred to four hundred nanometers by means of CVD deposition using tetraethoxysilane (TEOS). Alternatively, thermally grown silicon oxide or an oxide-nitride composite layer or the like can be used. Insulation layer 237 and semiconductor layer 234 are photolithographically patterned and etched to form an insulated base electrode 238 illustrated in FIG. 8. Base electrode 238 overlies base contact region 232 and a peripheral portion of oxide pad 230. A P-type intrinsic base region 240 is formed preferably by ion implantation of a P-type dopant, such as boron, into active well region 214 using base electrode 238 as an implant mask. The outline of base electrode 238 on N-well region 214 is used as a doping mask for the formation of an intrinsic base region 240. Intrinsic base region 240 is thus self-aligned to base electrode 238 and forms the active base for the bipolar transistor under construction. The ion implantation step establishes a dopant concentration of about $5 \times 10^{17}$ to $5 \times 10^{18}$ atoms per cubic centimeter in intrinsic base region 240.

Figure 9:
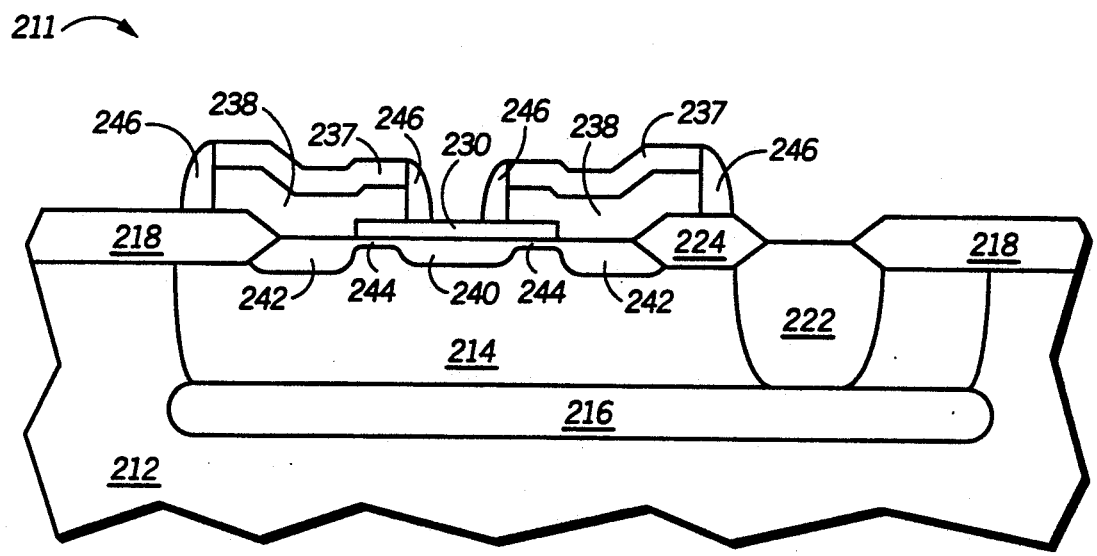

The process is continued as illustrated in FIG. 9. Following the formation of intrinsic base region 240, device 211 is thermally annealed to diffuse boron atoms from base electrode 238 into well region 214 to form an extrinsic base region 242 and a diffused base link 244. In base contact region 232, boron atoms diffuse directly from base electrode 238 directly into well region 214 forming a deeply diffused extrinsic base. Base link 244 is formed by boron atoms which diffuse through oxide pad 230 where the diffusion rate is limited by the flux of boron atoms through the oxide layer. The annealing process is carried out at a temperature of about 800° to 1000° C. for about 5 to 60 minutes. Base link 244 is characterized by a high boron concentration at the substrate surface and a uniform shallow doping profile in the substrate.

Following the annealing step, a sidewall spacer 246 is formed on base electrode 238 by first CVD depositing a layer of sidewall spacer forming material to a thickness of about one hundred to three hundred nanometers onto the base electrode, then, anisotropically etching the spacer forming material. Preferably, the sidewall spacer material is a dielectric material differentially etchable to silicon oxide such as silicon nitride. The portion of oxide pad 230 exposed by sidewall spacer 246 is etched away leaving oxide portions underlying sidewall spacer 246 and a portion of base electrode 238. A selective oxide etching process is used to remove the exposed portion of oxide pad 230 and expose a portion of the surface of well region 214 between oxide portions 248 and 250. In a preferred method, oxide pad 230 is RIE etched using fluorinated hydrocarbon etch gases to etch silicon oxide preferentially to the underlying substrate while avoiding damage to the substrate surface. During the etching of oxide pad 230, a portion of relatively thicker insulting layer 237 is also etched. The pad oxide etch process removes about 20 to 40 nanometers of material from the surface of insulating layer 237.

Figure 10:
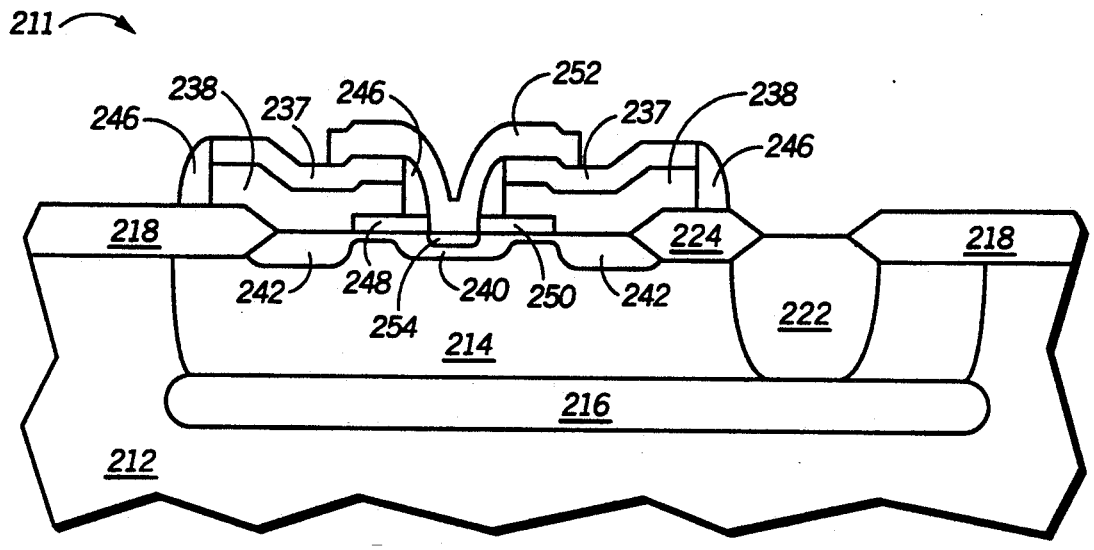

Once a contact opening has been made exposing a portion of the surface of well region 214, an emitter structure is formed as illustrated in FIG. 10. A polysilicon layer is then CVD deposited to a thickness of about 100 to 300 nanometers and is doped with an N-type impurity, either during polysilicon deposition, or immediately after deposition. Next, the polysilicon layer is anisotropically etched to form the emitter electrode 252 depicted in FIG. 10. The dopants previously introduced into the emitter are diffused into well region 214 to form an emitter region 254. Emitter region 254 is formed entirely within base intrinsic base region 240 and forms a PN junction therewith at a point in well region 214 directly beneath emitter electrode 252.

The process then continues in a conventional manner to complete the fabrication of semiconductor device 211 including the formation of a collector electrode, passivation overcoat and metal contacts to interconnect the electrodes with other circuit elements. For the purpose of clearly illustrating the present embodiment these additional structures are not shown.

Semiconductor device 211, formed in accordance with the invention, exhibits improved electrical performance by forming base link 244 intermediate to extrinsic base regions 242 and intrinsic base region 240. The high dopant concentration at the surface of base link 244, provided by diffusing boron atoms through oxide pad 230, prevents the highly doped extrinsic base regions from overlapping the intrinsic region and lowering the emitter-base breakdown voltage. In addition, the boron diffused base link reduces hot carrier injection along the emitter periphery because a more gradual change of the dopant concentration in the emitter-base region is achieved.

Process Embodiment III

Figure 11:
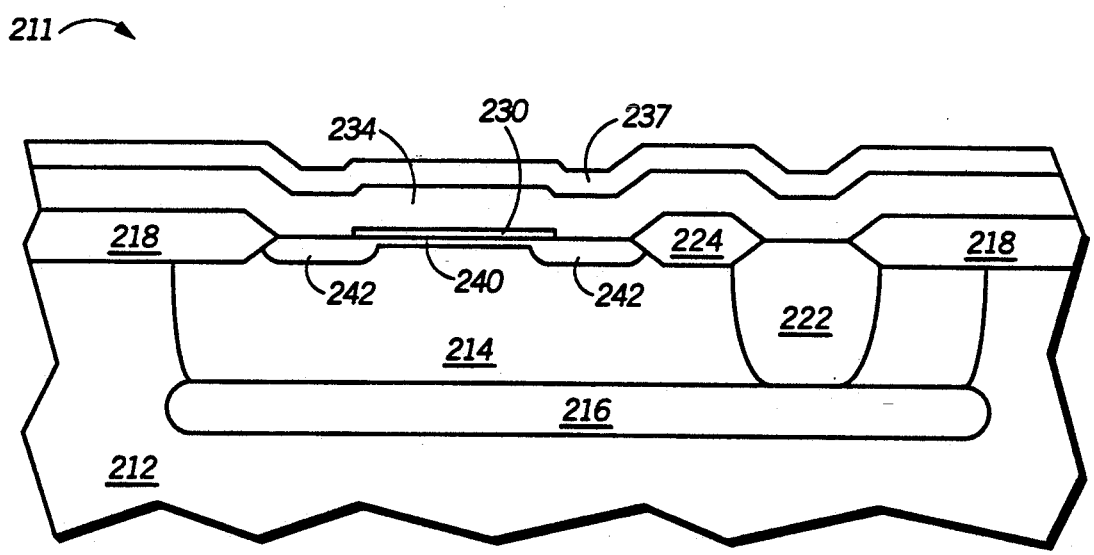
FIG. 11 illustrates, in cross section, a semiconductor device formed in accordance with yet another embodiment of the invention.

Alternatively, as may be desirable because of the particular electrical requirements of the semiconductor device under construction, the extrinsic and intrinsic base regions can be formed in a single diffusion step. To form the extrinsic and intrinsic base regions in a single step, the $BF_2$ doping step illustrated in FIG. 7 is performed and resist pattern 236 is removed. As previously described, insulating layer 237 is deposited onto semiconductor layer 234 to form an insulation cap over semiconductor layer 234. An anneal, in the presence of hydrogen gas, is performed to diffuse the boron in semiconductor layer 234 into substrate 212 forming both intrinsic base region 240 and extrinsic base region 242 in a single diffusion step. The resulting doping structure is illustrated in FIG. 11. A shallow intrinsic base region having a high surface doping concentration is formed by diffusion of boron atoms through oxide pad 230. Following the boron diffusion step, processing is performed in an identical manner to that previously described and illustrated in FIGS. 9 and 10.

Without further elaboration, it is believed that one skilled in the art can, using the preceding description, utilize the invention to its fullest extent. The following example is, therefore, to be construed as merely illustrative, and not limitative of the remainder of the disclosure in any way whatsoever.

EXAMPLE

Beginning with an N-type silicon substrate having a surface concentration of about $10^{17}$ atoms per cubic centimeter, a 7.5 nanometer gate oxide was thermally grown on the substrate surface. A first polysilicon layer was CVD deposited to a thickness of 250 nanometers onto the gate oxide. Using conventional photolithography, a pattern was defined on the polysilicon and the polysilicon was anisotropically etched to form a gate electrode structure. The photoresist pattern was removed and an oxide layer was formed on the gate electrode by thermal oxidation. A second polysilicon layer was deposited to a thickness of 150 nanometers onto the substrate and the gate electrode. The second polysilicon layer was doped by ion implantation of $BF_2$ with a dose of $1 \times 10^{16}$ ions per square centimeter. After implanting the polysilicon layer, a low temperature oxide (LTO) layer was deposited followed by the low temperature deposition of a silicon nitride layer. An anneal step was performed for 45 minutes at 900° C. to diffuse the boron from the second polysilicon layer, through the gate oxide and into the substrate. The silicon nitride layer and the LTO layer were removed and the second polysilicon layer anisotropically etched to form a sidewall spacer on the gate electrode. Then, heavily doped P+ source and drain regions were formed in the substrate by ion implantation of boron with a dose of $5 \times 10^{15}$ ions per square centimeter. After performing the P+ implant, the substrate was annealed for 15 minutes at 900° C. A passivation layer was deposited and metal contacts were formed in a conventional manner to complete the device fabrication.

Figure 12:
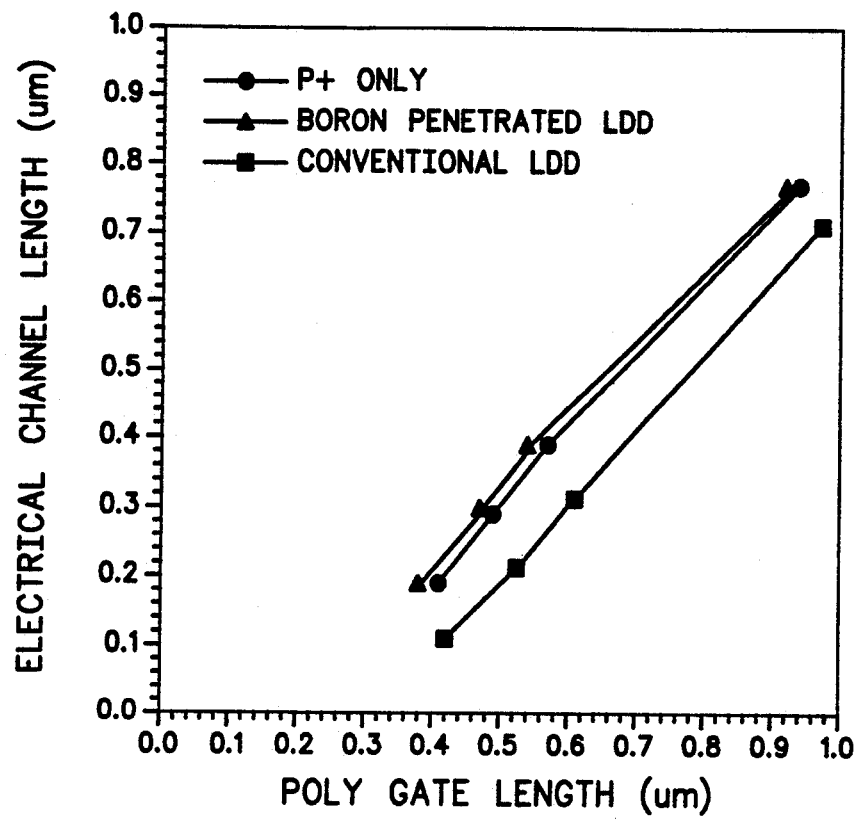
FIG. 12 is a plot of effective channel length versus physical gate length for a device formed in accordance with the invention versus devices of the prior art.

Shown in FIG. 12, is a plot of the effective channel length (in microns) versus the physical gate electrode length (in microns) for devices fabricated using conventional processes (labeled "P+ only" and "conventional LDD" respectively) and the structure formed according to the above example (labeled "boron penetrated LDD"). As can be observed in the plot, the boron penetrated structure has a larger effective channel length for a given physical gate length than corresponding devices of the prior art. This result indicates the device formed in accordance with the invention is effectively preventing the electrical field of the heavily doped P+ regions from overlapping onto the gate region.

Figure 13:
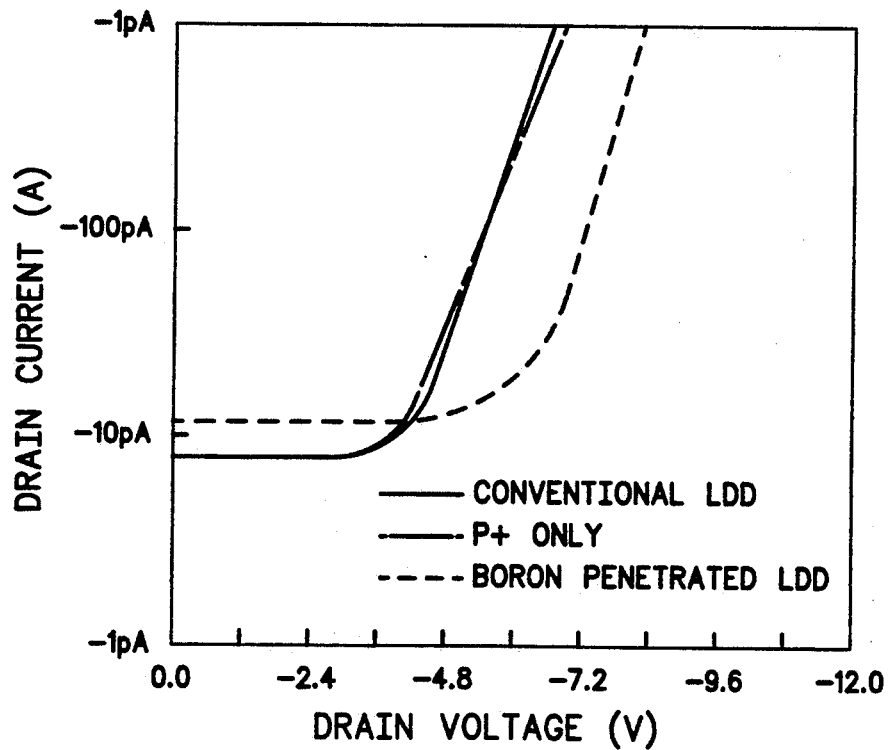
FIG. 13 is a plot of log drain current versus drain voltage for a device formed in accordance with the invention versus devices of the prior art.

Shown in FIG. 13, is a plot of the log of drain current (in amps) versus drain voltage (in volts) at 0 applied gate voltage for devices of the prior art (labeled "P+ only" and "conventional LDD" respectively) and the structure formed according to the above example (labeled "boron penetrated LDD"). The results shown in the plot indicate an increased drain breakdown voltage is achieved compared to devices of the prior art. This increase is believed to be brought about through a reduction in the gate induced drain barrier lowering achieved by the shallow boron LDD region formed in accordance with the invention.

Thus it is apparent that there has been provided, in accordance with the invention, a method for forming a semiconductor device having a shallow doped region which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, discrete components such as diodes can be fabricated with diffused structures formed by boron penetration. Furthermore, MOS devices and bipolar devices can be simultaneously fabricated in accordance with the invention on the same semiconductor substrate to produce BiCMOS devices. It is therefore intended to include within the invention all such variations and modifications as fall within the scope of the appended claims and equivalents thereof.

We claim:

1. A method for fabricating a semiconductor device having a shallow doped region comprising the steps of:
   providing an N-type semiconductor substrate having a surface;
   forming a dielectric layer overlying at least a portion of the substrate surface;
   forming a patterned material layer having a fluorinated-boron constituent overlying the dielectric layer;
   implanting boron atoms into the substrate to form a first P-type impurity region having a first junction depth, using the patterned material layer as an implant mask; and
   diffusing boron atoms in the presence of hydrogen from the patterned material layer through the dielectric layer and into the substrate to form a second P-type impurity region adjacent to the first P-type region, wherein the second impurity region has a selected junction depth closer to the substrate surface than the first selected depth;
   the second P-type impurity region being characterized by a high dopant concentration at the substrate surface and a uniform shallow junction profile in the substrate.

2. The method of claim 1 wherein the step of doping the material layer comprises ion implantation of fluorinated boron ions into the material layer.

3. The method of claim 1 wherein the step of forming a material layer comprises deposition of a polysilicon layer.

4. The method of claim 1 wherein the semiconductor substrate is single cyrstal silicon and the step of forming a dielectric layer comprises oxidizing the substrate surface to form silicon oxide.

5. A method of fabricating a semiconductor device having a shallow doped region comprising:
   providing an N-type semiconductor substrate having a surface;
   forming a dielectric layer overlying at least a portion of the substrate surface;
   forming a material layer having a fluorinated-boron constituent overlying the dielectric layer; and
   diffusing boron atoms in the presence of hydrogen from the material layer directly into substrate regions not covered by the dielectric layer to form a first P-type impurity region, and
   diffusing boron atoms through the dielectric layer and into the substrate to form a second P-type impurity region adjacent to the first P-type region, wherein the second impurity region has a selected junction depth closer to the substrate surface than the first selected depth,
   the second P-type impurity region being characterized by a high dopant concentration at the substrate surface and a uniform shallow junction profile in the substrate.

6. A method for fabricating a semiconductor device comprising the steps of:

providing a semiconductor substrate having a surface;

forming an oxide pad overlying a portion of the substrate and leaving an exposed surface portion;

forming a boron doped material layer overlying the exposed surface portion and the oxide pad;

forming an extrinsic base region below the exposed surface portion of the substrate by diffusion of boron from the material layer, the extrinsic base region having a first junction depth; and diffusing boron atoms from the material layer through the oxide pad into the substrate in the presence of hydrogen to form an intrinsic base region adjacent to the extrinsic base region, wherein the intrinsic base region has a second junction depth closer to the substrate surface than the first junction depth, the intrinsic base region being characterized by a high dopant concentration at the substrate surface and a uniform doping profile in the substrate.

7. The method of claim 6 further comprising forming an insulating layer overlying the boron doped material layer.

8. The method of claim 6 wherein the step of forming a doped material layer comprises the steps of depositing a layer of polysilicon and implanting $BF_2$ ions into the polysilicon layer.

9. The method of claim 6 wherein the step of forming an oxide pad comprises thermally oxidizing the substrate to form an oxide layer having a thickness of 5 to 15 nanometers.

10. The method of claim 6 wherein the step of diffusing boron atoms comprises thermally annealing at a temperature of 800° to 1000° C. for 5 to 60 minutes.

11. A method for fabricating a semiconductor device comprising the steps of:

providing a substrate having a surface;

forming an oxide layer overlying the substrate surface;

patterning the oxide layer to form an oxide pad overlying a first portion of the substrate and exposing a second portion of the substrate;

forming a boron doped polysilicon layer overlying the oxide pad and the second portion of the substrate;

etching the polysilicon layer to expose a central portion of the oxide pad;

implanting dopant atoms into the substrate through the exposed central portion of the oxide pad to form an intrinsic base region in the substrate;

diffusing boron atoms from the polysilicon layer into the second portion of the substrate to form an extrinsic base region; and diffusing boron atoms from the polysilicon layer through a peripheral portion of the oxide pad to form a shallow base link intermediate to the intrinsic and extrinsic base regions wherein the base link has a junction depth closer to the substrate surface than the intrinsic and extrinsic base regions and prevents the electric field from the extrinsic base region from overlapping the electric field of the intrinsic base region, the base link characterized by a high dopant concentration at the substrate surface and a uniformly shallow doping profile in the substrate.

12. The method of claim 11 wherein the extrinsic and intrinsic base regions and the shallow base link are of the same conductivity type.

13. The method of claim 11 wherein the step of forming a boron doped polysilicon layer comprises implanting $BF_2$ ions into the polysilicon layer.

14. The method of claim 11 wherein the step of forming an oxide layer comprises thermally oxidizing the substrate to form an oxide layer having a thickness of 5 to 15 nanometers.

15. The method of claim 11 wherein the step of diffusing boron atoms comprises thermally annealing at a temperature of 800° to 1000° C. for 5 to 60 minutes.

16. A method for fabricating a semiconductor device comprising the steps of:

providing an N-type substrate having an oxide layer thereon;

patterning the oxide layer to form an oxide pad overlying a first portion of the substrate and exposing a second portion of the substrate;

forming a polysilicon layer overlying the oxide pad and the second portion of the substrate;

implanting $BF_2$ ions into the polysilicon layer;

forming a passivation layer overlying the polysilicon layer;

forming a photoresist pattern overlying the passivation layer;

etching the passivation layer and the polysilicon layer to expose a central portion of the oxide pad;

implanting boron atoms into the substrate through the exposed central portion of the oxide pad to form an intrinsic base region in the substrate;

removing the photoresist mask; and diffusing boron atoms from the polysilicon layer into the second portion of the substrate in the presence of hydrogen to form an extrinsic base region while simultaneously diffusing boron atoms from the polysilicon layer through a peripheral portion of the oxide pad to form a shallow base link intermediate to the extrinsic and intrinsic base regions, wherein the base link has a junction depth closer to the substrate surface than the corresponding junctions of the extrinsic and intrinsic base regions, the base link characterized by a high dopant concentration at the substrate surface and a uniformly shallow doping profile in the substrate.

17. The method of claim 16 further comprising forming an N-type emitter region in the intrinsic base region.

18. The method of claim 16 wherein the step of forming an oxide layer comprises thermally oxidizing the substrate to form an oxide layer having a thickness of 5 to 15 nanometers.

19. The method of claim 16 wherein the step of diffusing boron atoms comprises thermally annealing at a temperature of 800° to 1000° C. for 5 to 60 minutes.

* * * * *